(12) United States Patent
Yon et al.

(10) Patent No.: US 7,244,935 B2
(45) Date of Patent: Jul. 17, 2007

(54) THERMAL ELECTROMAGNETIC RADIATION DETECTOR WITH ALVEOLATE STRUCTURE

(75) Inventors: Jean-Jacques Yon, Sassenage (FR); Jean-Louis Ouvrier-Buffet, Sevrier (FR); Astrid Astier, Voreppe (FR); Michel Vilain, Saint Georges des Commiers (FR)

(73) Assignee: Commissariat a l'Energie Atomique, Paris (FR)

( * ) Notice: Subject to any disclaimer, the term of this patent is extended or adjusted under 35 U.S.C. 154(b) by 50 days.

(21) Appl. No.: 10/551,425

(22) PCT Filed: Apr. 16, 2004

(86) PCT No.: PCT/FR2004/000942

§ 371 (c)(1),
(2), (4) Date: Oct. 3, 2005

(87) PCT Pub. No.: WO2004/097355

PCT Pub. Date: Nov. 11, 2004

(65) Prior Publication Data

US 2006/0273256 A1    Dec. 7, 2006

(30) Foreign Application Priority Data

Apr. 24, 2003    (FR) .................................. 03 05030

(51) Int. Cl.
*G01J 5/00*    (2006.01)

(52) U.S. Cl. .................................................. 250/338.1
(58) Field of Classification Search .............. 250/338.1
See application file for complete search history.

(56) References Cited

U.S. PATENT DOCUMENTS

| | | | | |
|---|---|---|---|---|
| 5,638,599 | A | * | 6/1997 | Beratan et al. ............... 29/854 |
| 5,990,481 | A | | 11/1999 | Beratan |
| 6,094,127 | A | | 7/2000 | Yong |
| 6,144,030 | A | | 11/2000 | Ray et al. |
| 6,506,621 | B1 | | 1/2003 | Artmann et al. |

FOREIGN PATENT DOCUMENTS

WO    WO 03/011747 A1    2/2003

* cited by examiner

*Primary Examiner*—Constantine Hannaher
(74) *Attorney, Agent, or Firm*—Oliff & Berridge, PLC

(57) ABSTRACT

An absorbent membrane (1) is fixed in suspension onto a front face of a substrate (2), in a direction substantially parallel to the substrate (2), by at least one alveolate structure thermally insulating the membrane from the substrate (2) and arranged in a plane substantially perpendicular to the substrate (2). The detector can comprise arms (3) fixedly secured to the absorbent membrane (1). The alveolate structures can be respectively arranged between one of the arms (3) and the substrate (2). The alveolate structure can be formed by a plurality of superposed thin layers (6) separated by spacers (7) or by superposed rows of arcades formed by thin layers. The alveolate structure can comprise a porous pad.

12 Claims, 3 Drawing Sheets

THERMAL ELECTROMAGNETIC RADIATION DETECTOR WITH ALVEOLATE STRUCTURE

BACKGROUND OF THE INVENTION

The invention relates to a thermal electromagnetic radiation detector comprising an absorbent membrane fixed in suspension onto a front face of a substrate, in a direction substantially parallel to the substrate, by support means thermally insulating the membrane from the substrate.

STATE OF THE ART

Recent technical advances in silicon microelectronics and thin film production have given a new boost to the technology of thermal infrared radiation detectors comprising an absorbent membrane fixed in suspension onto a substrate by support means.

Moreover, microelectronics is based on collective processes, performed at silicon wafer level, which processes thermal detector technologies can take advantage of in many respects. These collective techniques in fact open up the possibility of achieving detector matrices of large complexity, typically matrices of 320×240 detectors, and also of achieving a large number of matrices on a single silicon wafer and therefore of reducing the unit production cost of the detectors. This feature, associated with the fact that thermal detectors can operate at ambient temperature and not require any cooling system, makes this technology particularly well suited for achieving low-cost infrared imagery systems.

FIGS. 1 and 2 show a membrane 1, absorbent with respect to incident electromagnetic radiation, of a thermal detector, kept in suspension substantially parallel to a substrate 2 by support means comprising two thermal insulation arms 3, fixedly secured to the membrane 1 and arranged substantially in the plane of the membrane 1. The arms 3 are both fixed to the substrate 2 by means of pillars 4 dimensioned to support the weight of the membrane. Due to the effect of the radiation, the membrane heats and transmits its temperature to a thermometer arranged on the membrane, for example a thermistor in the form of a thin film deposited on the membrane.

The substrate 2 can be formed by an electronic circuit integrated on a silicon wafer comprising, on the one hand, the thermometer stimuli and reading devices and, on the other hand, multiplexing components which enable the signals from different thermometers to be serialized and transmitted to a reduced number of outputs to be used by a usual imagery system. To improve the sensitivity of the thermal detector, the support means are designed in such a way as to insulate the absorbent membrane 1 thermally from the substrate 2, thus enabling the heat losses of the membrane to be limited and, consequently, preserving heating of the membrane.

Electrical interconnection between the thermometer and the reading elements arranged on the substrate 2 is generally performed by a metal layer arranged on the support means.

A simplified analysis of heating ($\Theta$) of the membrane due to the effect of the power effectively absorbed ($P_{abs}(t)$) from the incident radiation can be performed, a priori, without any particular assumption on the nature of the thermometer. The heating balance, dependent on the thermal conductance $G_{th}$ of the support means, representing the heat losses, and on the heat capacity $C_{th}$ of the membrane, representing the thermal inertia, can be expressed approximately by the following differential equation:

$$C_{th}\frac{d\Theta}{dt} + G_{th}\Theta = P_{abs}(t).$$

This equation finds its particular solution, for a radiation power modulated in sinusoidal manner at the pulse $\omega$ in the expression:

$$\Theta = \frac{\hat{P}_{abs}(t)}{G_{th}\sqrt{1+\omega^2\tau^2}},$$

where $\tau$ represents the thermal time constant of the membrane defined by $\tau = C_{th}/G_{th}$.

The temperature variations of the membrane follow the incident radiation power variations. At low frequencies, i.e. $\omega\tau \ll 1$, the amplitude of the temperature rise, which defines the signal delivered by the detector, is inversely proportional to $G_{th}$:

$$\Theta = \frac{P_{abs}}{G_{th}}.$$

At high frequencies, i.e. $\omega\tau \gg 1$, the detector signal decreases as the inverse of the modulation frequency. This sensitivity reduction at high frequencies is all the more marked the larger $C_{th}$:

$$\Theta = \frac{P_{abs}}{\omega C_{th}}.$$

The transition between these two regimes is characterized by the thermal time constant $\tau$.

It results from this analysis that the basic characteristics defining the performance of the thermal detector are the thermal conductance $G_{th}$ and the heat capacity $C_{th}$, which it is sought to minimize in order to optimize the sensitivity of the detector. Consequently, low thermal conductivity materials are used for the support means, and low specific heat materials are used for the absorbent membrane. In addition, the membrane generally presents a small thickness.

In order to minimize the thermal conductance of the support means, the air is removed from the space between the membrane 1 and substrate 2 (FIGS. 1 and 2) or the space is filled with low thermal conductivity gas. In addition, the arms 3 fixedly secured to the membrane 1 often present a maximal length, compatible with other constraints. In the case of simple thermal insulation arms, represented in FIG. 1, the maximal length corresponds substantially to the dimension of the membrane. A development of this technique consists in fabricating thermal insulation arms folded onto themselves, in the form of a coil, thus presenting a length corresponding to a multiple of the dimension of the membrane. The drawback of this technique is that it restricts the surface of the absorbent membrane and thus restricts the effective surface of the detector.

The document U.S. Pat. No. 6,144,030 discloses a microbolometer comprising thermal insulation arms folded onto themselves and arranged between the membrane and substrate, which enables the effective surface to be preserved while lengthening the thermal insulation arms constituting the support means. However, this construction presents several drawbacks:

Mechanical securing of the arms in the form of a coil, cantilevered by an anchorage point positioned at the end of the coil, requires an increased thickness of the arms and, thereby, an increase of the thermal conductance.

This construction is unsuitable for achieving interferential cavities, commonly used to optimize radiation absorption. The interferential cavities presenting the best performances are in fact usually achieved by placing a reflecting metal layer a few nanometers thick on the substrate. This reflecting layer, in conjunction with the membrane, forms a quarter-wave plate centered on the wavelength to be detected. The arms arranged between the membrane and the substrate constitute a disturbing element that is open to criticism. To overcome this difficulty, it is proposed to position the reflecting layer on the support means, in particular on the arms. However, infrared-reflecting materials are characterized by very high thermal conductivities detrimental to a good thermal insulation.

This construction leads to an increase of the suspended weight, all the more so if the option of placing a reflecting layer on the support means is chosen. This weight increase increases the thermal time constant and the vulnerability of the detector to mechanical aggressions, for example shocks and vibrations.

Finally, this construction, in addition to the means for fixing the arms to the substrate, requires means for fixing the membrane to the arms, enabling electrical interconnection of a thermometer. This results in an increased complexity of the production technology.

Another way of minimizing the thermal conductance consists in reducing the cross-section of the thermal insulation arms or, more generally, of the support means. However, too small cross-sections impair the mechanical solidity of the detector and can lead to bending of the support means, resulting in rocking of the membrane until it comes into contact with substrate, thus short-circuiting the thermal insulation.

Rocking can be prevented by adding a mechanical connection that connects two adjacent membranes to one another. The drawback of this mechanical connection lies in the thermal coupling between the two membranes, which leads to an impairment of the spatial resolution of the device. Another means of preventing rocking consists in increasing the number of anchorage points of the support means on the substrate, however this increases the thermal conductance.

In general, optimization of thermal radiation detectors involves making a compromise between the length of the support means on the one hand and the cross-section of the latter on the other hand, a compromise arbitrated by their mechanical strength.

The document WO 03,011,747 describes a gas sensor comprising a suspended membrane connected to a substrate by means of porous silicon bridges and cantilevers. The bridges and cantilevers are arranged in the same (horizontal) plane as the suspended membrane. They are directly formed, in this plane, in the substrate the parts whereof corresponding to the bridges, cantilevers and membrane are rendered porous. A cavity is then hollowed out under the membrane and under the bridges and cantilevers.

OBJECT OF THE INVENTION

The object of the invention is to remedy these drawbacks and, in particular, to provide a detector, comprising an absorbent membrane and support means, presenting a high thermal insulation capacity while ensuring an enhanced mechanical securing.

According to the invention, this object is achieved by the accompanying claims and, more particularly, by the fact that the support means comprise at least one alveolate structure arranged in a plane substantially perpendicular to the substrate.

BRIEF DESCRIPTION OF THE DRAWINGS

Other advantages and features will become more clearly apparent from the following description of particular embodiments of the invention, given as non-restrictive examples only and represented in the accompanying drawings, in which.

DESCRIPTION OF PARTICULAR EMBODIMENTS

Figure 1:
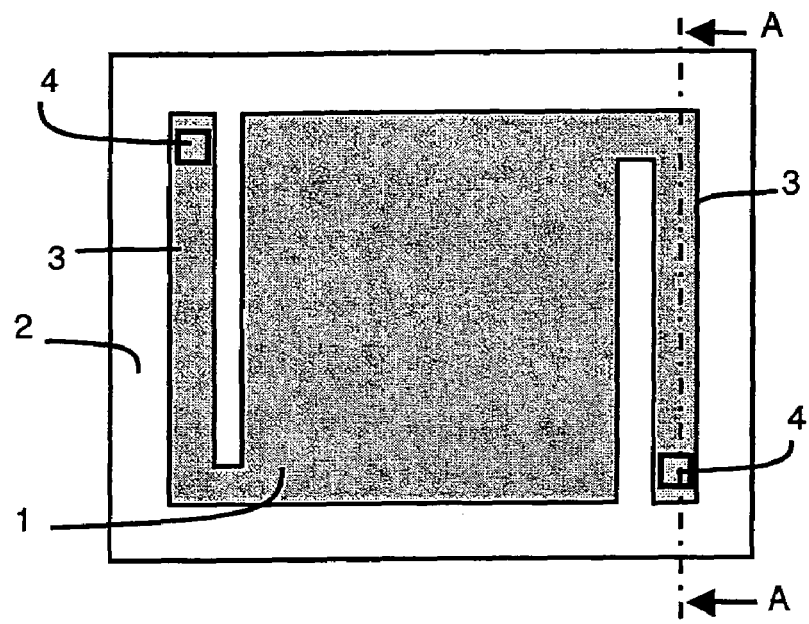
FIGS. 1 and 2 represent a thermal detector according to the prior art respectively in top view and in cross-section along the line AA.
Figure 2:
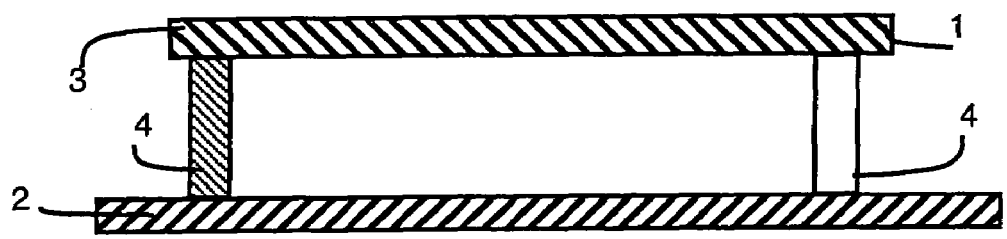

FIGS. 3 to 6 show a thermal electromagnetic radiation detector comprising an absorbent membrane 1, fixed in suspension onto a front face of a substrate 2, in a direction substantially parallel to the substrate 2, by support means thermally insulating the membrane 1 from the substrate. The support means comprise, as in FIG. 1, two thermal insulation arms 3, fixedly secured to the membrane 1 and both fixed onto a thin pillar 4, and two alveolate structures. Each alveolate structure is formed by a wall arranged in a plane substantially perpendicular to the substrate 2 and, therefore, perpendicular to the membrane 1. Each alveolate structure presents a plurality of transverse openings. The thermal insulation arms 3 extend along two opposite sides of the membrane and the length thereof corresponds substantially to the dimension of the membrane. Each of the alveolate structures is arranged respectively between one of the two arms 3 and the substrate 2 and is in contact with the corresponding arm 3 via at least one bearing point 5 (three bearing points in FIG. 3 and a single bearing point in the other figures). The alveolate structure can also be arranged between the absorbent membrane 1 and the substrate 2, along one edge of the absorbent membrane 1.

Figure 3:
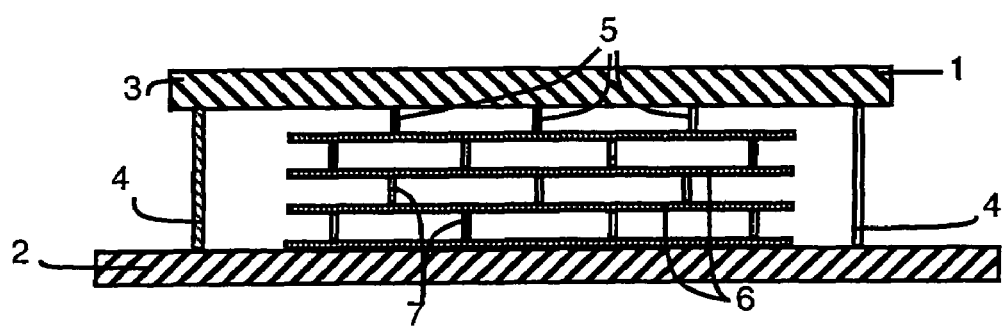
FIGS. 3, 4, 6 and 7 represent particular embodiments of the invention.
Figure 4:
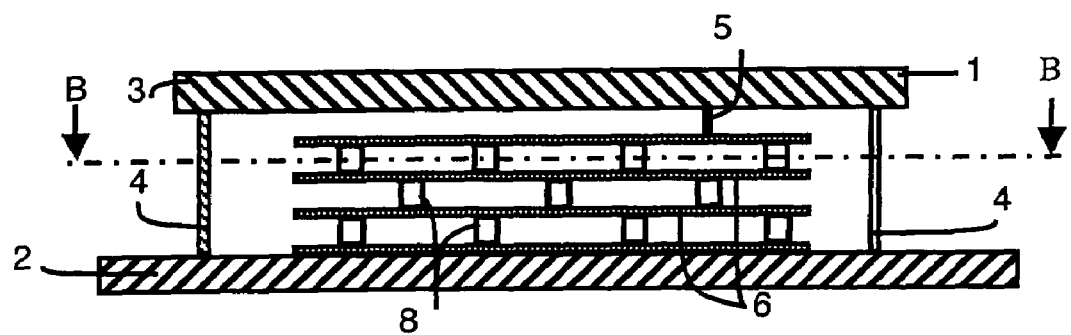
Figure 5:
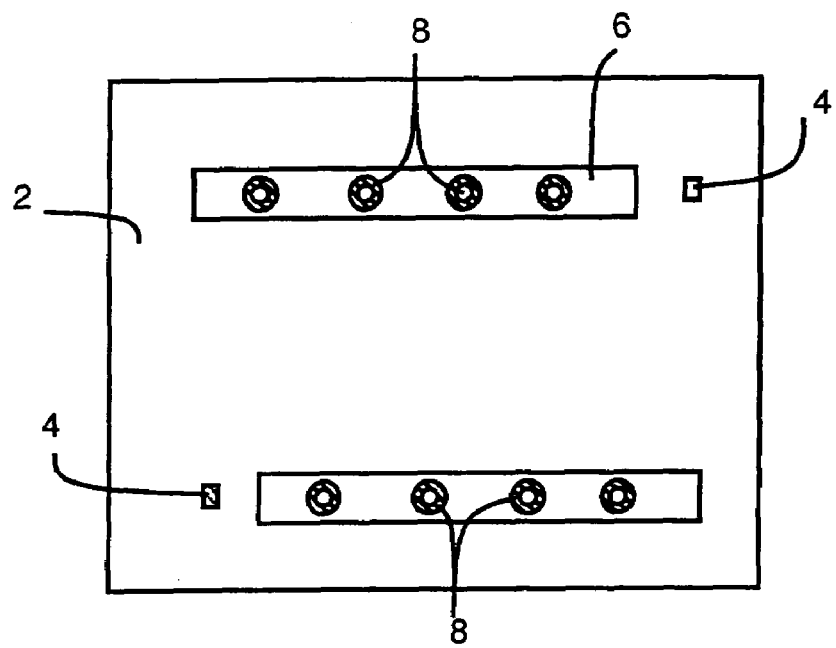
FIG. 5 illustrates the particular embodiment represented in FIG. 4, in cross-section along the line BB.

The walls represented in FIGS. 3 to 5 each comprise a plurality of superposed thin layers 6, separated by spacers 7 or 8. The spacers represented in FIG. 3 are formed by partitions 7, perpendicular to the substrate 2, whereas the spacers represented in FIGS. 4 and 5 are formed by hollow cylinders 8, also arranged perpendicularly to the substrate 2. The alveolate structure can have different shapes: parallelepipedic, as represented in FIG. 3, pyramidal, inverted pyramidal, etc. . . . The alveolate structure can be arranged at different locations under the suspended structure, along thermal insulation arms 3, as represented in FIGS. 3 and 4, or on the contrary along one side of the membrane perpendicular to the arms 3. Thus, the zone situated under the membrane 1 remains free from any disturbing element liable to impair the functioning of an interferential cavity between the substrate 2 and membrane 1, achieved by deposition of a reflecting layer on the substrate under the membrane 1 to improve the absorption ratio of the detector.

Figure 6:
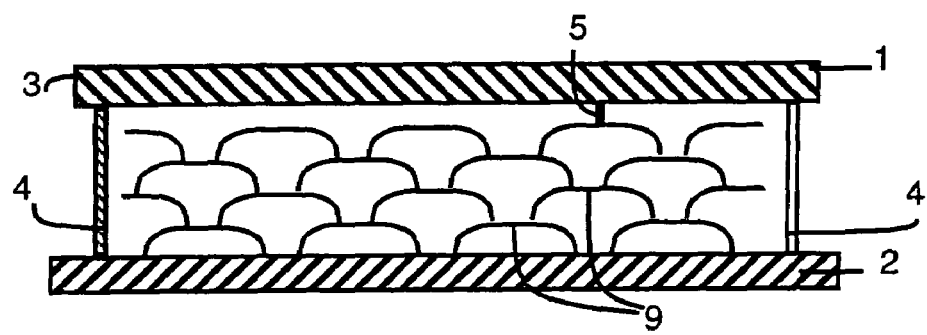

The wall represented in FIG. 6 comprises three superposed rows of arcades 9 formed by thin layers, a first row of arcades 9 being arranged on the front face of the substrate 2, each arcade of one of the top rows being arranged on the top parts of two adjacent arcades 9 of the bottom row.

Figure 7:
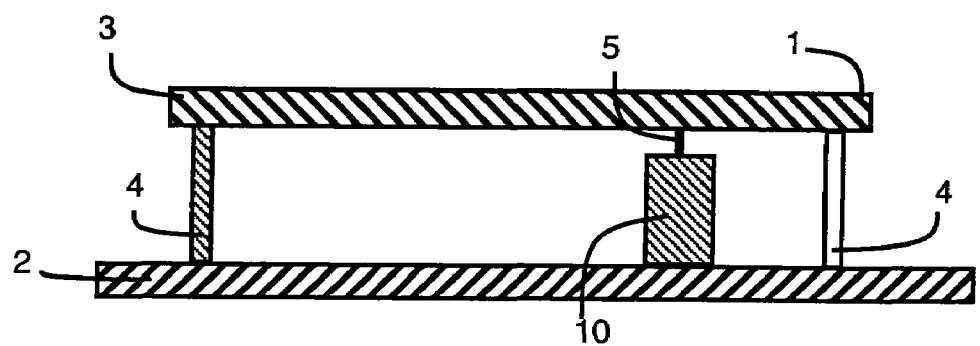

In an alternative embodiment of the invention, represented in FIG. 7, the alveolate structure comprises a porous pad 10, which by nature represents an alveolate structure. Different materials can be suitable for this application, in particular silicon oxides deposited by gel sol techniques, or porous silicon obtained by anodic oxidation in HF medium of the crystalline silicon and which can be added onto the substrate 2 acting as support, prior to construction of the suspended structures. After deposition, or addition of the porous material if this is the case, the porous layer is delineated by standard photolithography and etching processes to define the pad 10.

Advantageously, the substrate 2 is made of silicon and can comprise integrated electronic devices enabling the signal coming from the thermometer (not represented) positioned on the membrane and measuring the temperature rise of the membrane to be read and processed. The thermometer can for example be a thermistor or a pyroelectric, ferroelectric or thermoelectric sensor. In the particular case of thermistors, numerous materials can be suitable, in particular semiconductors, such as amorphous, polycrystalline or crystalline silicon or germanium; metal oxides, for example vanadium oxides, manganites; metals with a high temperature coefficient, for example titanium-base alloys or Fe—Ni alloys.

The membrane 1 can be formed by the material constituting the thermometer itself or by any other material whose chemistry is compatible with the material constituting the thermometer, for example by silicon oxides, nitrides or any other dielectric semi-conductor.

The thermal insulation arms 3 can be made from at least one of the materials that constitute the membrane 1. In this case, and if the membrane comprises several suspended layers, the arms 3 extend as a continuation of at least one of the layers forming the membrane. To ensure thermal insulation, the arms 3 can for example be made of silicon oxide, silicon nitride or amorphous silicon.

In addition to their mechanical securing role, the pillars 4 can also perform electrical interconnection between the thermometer electrodes, which can be extended along the thermal insulation arms 3, and the inputs of the electronic signal reading and processing devices which are advantageously arranged on the substrate 2 or, possibly, on a printed circuit board located nearby.

The alveolate structures support the membrane 1 mechanically, providing at least one bearing point 5, without however increasing the thermal conductance of the support means. The bearing point or points 5 enable the cross-section of the arms 3 to be reduced, which enables a higher thermal insulation to be achieved than in the prior art.

An estimation of the thermal insulation capacity of the alveolate structures enables the advantages of the invention as compared with the prior art to be highlighted, considering a square thermal detector with 25 µm sides, corresponding to the most advanced devices currently being developed for infrared imagery. The ultimate thermal insulation ($R_{rad}$) of a flat detector is limited by the radiative losses which depend both on the surface ($S_D$) of the detector and on its operating temperature (T):

$$R_{rad} = \frac{1}{4(2S_D)\sigma T^3},$$

where $\sigma$ is the Stefan-Boltzmann constant.

At ambient temperature and for the detector size mentioned, the ultimate thermal insulation is theoretically 160 MK/W. The thermal insulation of a known detector is lower as it is reduced by the heat losses by conduction in the thermal insulation arms. The usual values are comprised between 5 MK/W and 30 MK/W.

Figure 8:
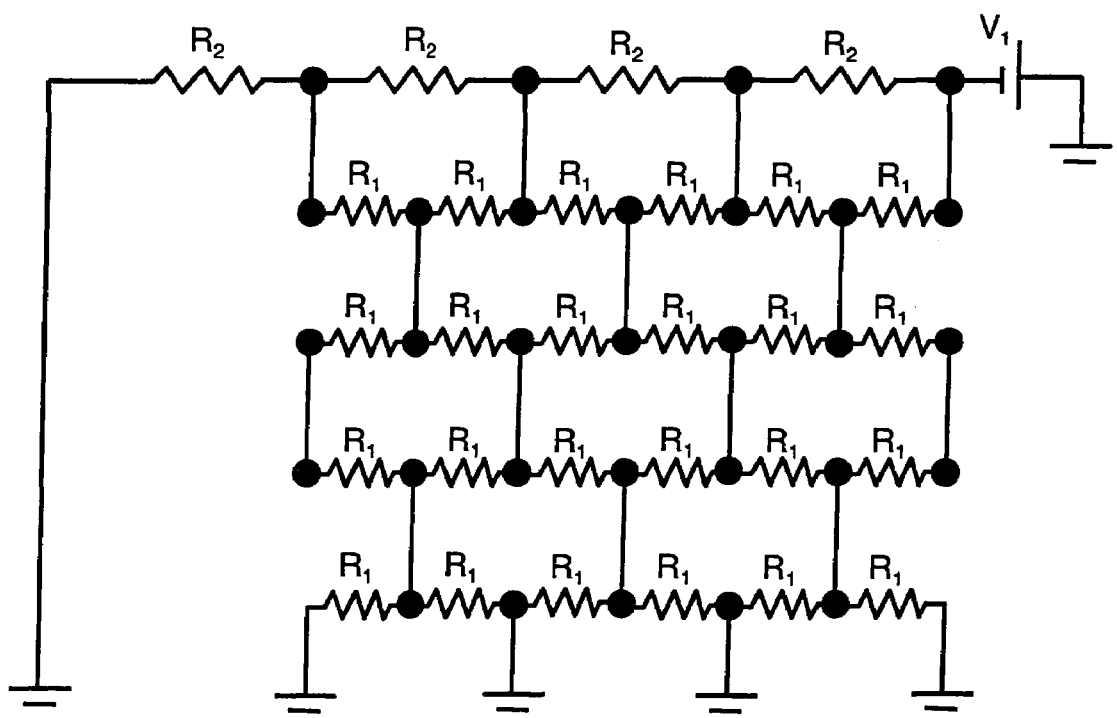
FIG. 8 shows a network of resistors, enabling the heat losses of a detector according to the invention to be estimated by analogy with a network of electrical resistors.

The thermal resistance of the alveolate structure can be modeled by a network of resistances, represented in FIG. 8. This network is formed on the one hand by resistances $R_1$ which represent the alveolate structure, and on the other hand by resistances $R_2$ which correspond to one of the thermal insulation arms 3. An alveolate structure is considered having four levels formed by layers of silicon oxide with a width of 1 µm and a thickness of 6 nm, separated from one another by vertical partitions the thermal impedance whereof is ignored. The vertical partitions are distributed uniformly with a pitch of 5 µm along one and the same level and are arranged staggered from one level to the other. The thermal insulation arm, with a width of 1 µm, is formed by a 20 nm layer of silicon oxide and a 5 nm layer of titanium nitride. The length of the thermal insulation arm is 17 µm and it is made up of four sections, the end of each section bearing on the underlying alveolate structure on four bearing points 5. For a detector comprising two assemblies each comprising a thermal insulation arm and an alveolate structure and taking the thermal conductivity of the materials into account, we find a thermal insulation of 90 MK/W, i.e. three times greater than that of the prior art.

When the number of bearing points 5 is reduced, the thermal insulation increases slightly. For example, the thermal insulation obtained with a single bearing point is 98 MK/W, i.e. very close to the result obtained with four bearing points.

When the number of the number of levels is reduced, the thermal insulation is also reduced. For example, the thermal insulation obtained with two levels is 72 MK/W. A structure with four levels therefore corresponds to a good compromise for a detector with a pitch of 25 µm, enabling the thermal insulation to be substantially improved while at the same time limiting the number of operations required for construction thereof.

A method for producing a detector according to the invention comprises fabrication of the alveolate structure, before the suspended membrane is achieved.

To achieve the alveolate structure represented in FIGS. 4 and 5, formed by superposed thin layers 6 separated by hollow cylinders 8, a sacrificial layer, made for example of polyimide, is deposited on the substrate 2 or on a thin layer 6, and is annealed. This sacrificial layer is then etched locally by photolithography making an alignment of holes with a diameter of 1 µm which pass through the whole thickness of the sacrificial layer. Then a dielectric layer with a typical thickness of 10 nm, covering the sacrificial layer and coating the sides and bottoms of the 1 µm diameter holes, is deposited for example by CVD. A subsequent step consists in delineating the extent of the dielectric layer by photolithography and etching to define the cross-section of the wall of the alveolate structure. A first thin layer 6 arranged on hollow cylinders 8 is thus obtained. This sequence of operations is then repeated for each additional thin layer 6, taking care to stagger the holes in zig-zagged manner from one level to the other, for example by using a suitable set of masks. The bearing point 5 on all of the thin layers is achieved by following substantially the same steps. The final step consists in eliminating the sacrificial layers, typically by means of an oxidizing dry etching.

To achieve the alveolate structure represented in FIG. 6, formed by superposed arcades composed of thin layers, a sacrificial layer is also deposited and annealed. The material chosen to form the sacrificial layer is a material presenting an etching rate close to those of commonly used photoresists, for example a polyimide. Then a photoresist is deposited in which openings of suitable width opening out onto the underlying sacrificial layer are delineated, for example by exposure through a mask and photographic development. Thermal treatment is then performed to make the flanks of the photoresist creep so as to give them the shape of an arc of a circle. Combined etching of the photoresist and of the sacrificial layer then enables the arc of a circle structures to be reproduced in the sacrificial layer in known manner. A subsequent step consists in depositing a dielectric layer, with a thickness typically smaller than 10 nm, covering the sacrificial layer and bearing on the underlying substrate at the places where etching of the sacrificial layer was total. Then, the width of the dielectric layer is delineated, for example to 1 μm, by photolithography and etching, so as to form a row of arcades 9. As in the previous method, the sequence of operations is repeated for each row of arcades, each time staggering the arcades one half-period with respect to the underlying arcades.

The invention claimed is:

1. A thermal electromagnetic radiation detector comprising an absorbent membrane fixed in suspension onto a front face of a substrate, in a direction substantially parallel to the substrate, by support means thermally insulating the membrane from the substrate, wherein the support means comprises at least one alveolate structure arranged substantially perpendicularly to the front face of the substrate and to the plane of the membrane and in contact with the membrane by a limited number of bearing points.

2. The detector according to claim 1, wherein the alveolate structure comprises a porous pad.

3. The detector according to claim 1, wherein the alveolate structure is in contact with the membrane by a single bearing point.

4. The detector according to claim 1, wherein the alveolate structure is in contact with the membrane by three bearing points.

5. A thermal electromagnetic radiation detector comprising an absorbent membrane fixed in suspension onto a front face of a substrate, in a direction substantially parallel to the substrate, by support means thermally insulating the membrane from the substrate, wherein the support means comprises at least one alveolate structure arranged substantially perpendicularly to the front face of the substrate and to the plane of the membrane, wherein the alveolate structure is arranged between the absorbent membrane and the substrate, along one edge of the absorbent membrane.

6. A thermal electromagnetic radiation detector comprising an absorbent membrane fixed in suspension onto a front face of a substrate, in a direction substantially parallel to the substrate, by support means thermally insulating the membrane from the substrate, wherein the support means comprises at least one alveolate structure arranged substantially perpendicularly to the front face of the substrate and to the plane of the membrane, wherein the support means comprises at least one arm fixedly secured to the absorbent membrane, each alveolate structure being respectively arranged between the corresponding arm and the substrate.

7. The detector according to claim 6, wherein the alveolate structure is in contact with an arm by a single bearing point.

8. A thermal electromagnetic radiation detector comprising an absorbent membrane fixed in suspension onto a front face of a substrate, in a direction substantially parallel to the substrate, by support means thermally insulating the membrane from the substrate, wherein the support means comprises at least one alveolate structure arranged substantially perpendicularly to the front face of the substrate and to the plane of the membrane, wherein the alveolate structure is formed by a wall presenting a plurality of transverse apertures.

9. The detector according to claim 8, wherein the wall comprises a plurality of superposed thin layers separated by spacers.

10. The detector according to claim 9, wherein the spacers are formed by partitions perpendicular to the substrate.

11. The detector according to claim 9, wherein the spacers are formed by hollow cylinders arranged perpendicularly to the substrate.

12. The detector according to claim 8, wherein the wall comprises at least two superposed rows of arcades formed by thin layers, a first row of arcades being arranged on the front face of the substrate, an arcade of another row being arranged on the top parts of two adjacent arcades of a lower row.

* * * * *